(12) United States Patent
Lu et al.

(10) Patent No.: US 10,362,699 B2
(45) Date of Patent: Jul. 23, 2019

(54) LOW DENSITY ELECTRONIC DEVICE

(71) Applicant: Amazon Technologies, Inc., Seattle, WA (US)

(72) Inventors: ChengChien Lu, San Jose, CA (US); David Eric Peters, Storrs, CT (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/454,752

(22) Filed: Mar. 9, 2017

(65) Prior Publication Data

US 2018/0263133 A1 Sep. 13, 2018

(51) Int. Cl.
| | |
|---|---|
| *H05K 5/00* | (2006.01) |
| *H05K 7/00* | (2006.01) |
| *H05K 5/06* | (2006.01) |
| *G06F 1/16* | (2006.01) |

(52) U.S. Cl.
CPC ........... *H05K 5/069* (2013.01); *G06F 1/1626* (2013.01); *G06F 1/1656* (2013.01); *H05K 5/0017* (2013.01); *H05K 5/065* (2013.01); *G06F 2200/1633* (2013.01)

(58) Field of Classification Search
CPC ..................................................... H05K 3/284
USPC ..................................................... 361/679.45
See application file for complete search history.

(56) References Cited

U.S. PATENT DOCUMENTS

| | | | |
|---|---|---|---|
| 5,461,256 A * | 10/1995 | Yamada | ........... G06K 19/07745 |
| | | | 257/679 |
| 6,440,772 B1 | 8/2002 | Smith | |
| 6,532,152 B1 | 3/2003 | White et al. | |
| 8,873,226 B1 * | 10/2014 | Peters | ................... G06F 1/1613 |
| | | | 361/679.01 |
| 9,275,930 B2 | 3/2016 | Mashimo et al. | |
| 9,468,118 B1 | 10/2016 | Peters | |
| 2003/0127248 A1 | 7/2003 | Kuo | |
| 2010/0065960 A1 | 3/2010 | Mino et al. | |
| 2010/0285260 A1 | 11/2010 | Bookbinder et al. | |
| 2013/0126533 A1 * | 5/2013 | Klosky | .................. B65D 25/00 |
| | | | 220/560 |
| 2013/0329460 A1 | 12/2013 | Mathew et al. | |

(Continued)

FOREIGN PATENT DOCUMENTS

| | | |
|---|---|---|
| EP | 1633176 A1 | 3/2006 |
| EP | 2012295 A1 | 1/2009 |

OTHER PUBLICATIONS

Office action for U.S. Appl. No. 14/733,799, dated Jan. 17, 2017, Rajagopalan et al., "Over-Mold Foam Enclosure", 12 pages.

(Continued)

*Primary Examiner* — Jerry Wu
(74) *Attorney, Agent, or Firm* — Lee & Hayes, P.C.

(57) ABSTRACT

An electronic device includes a display screen, one or more internal components, and a foam outer housing coupled to the display screen and enclosing the one or more internal components. The electronic device may also include a foam midframe enclosed by the foam outer housing. The foam outer housing may be resilient so as to provide impact absorption and water resistance, while the foam midframe may be rigid to provide stiffness to the electronic device. The electronic device may have a density less than 1 gram/centimeter$^3$ such that the electronic device is buoyant in liquid water.

19 Claims, 8 Drawing Sheets

(56) References Cited

U.S. PATENT DOCUMENTS

2014/0308469 A1    10/2014    Aida et al.
2014/0327624 A1    11/2014    Srinivas et al.

OTHER PUBLICATIONS

The PCT Invitation to Pay Additional Fees mailed on Jun. 20, 2018 for PCT application No. PCT/US2018/021190, 13 pages.
The PCT Search Report and Written Opinion dated Aug. 13, 2018, for PCT Application No. PCT/US18/21190, 19 pages.

* cited by examiner

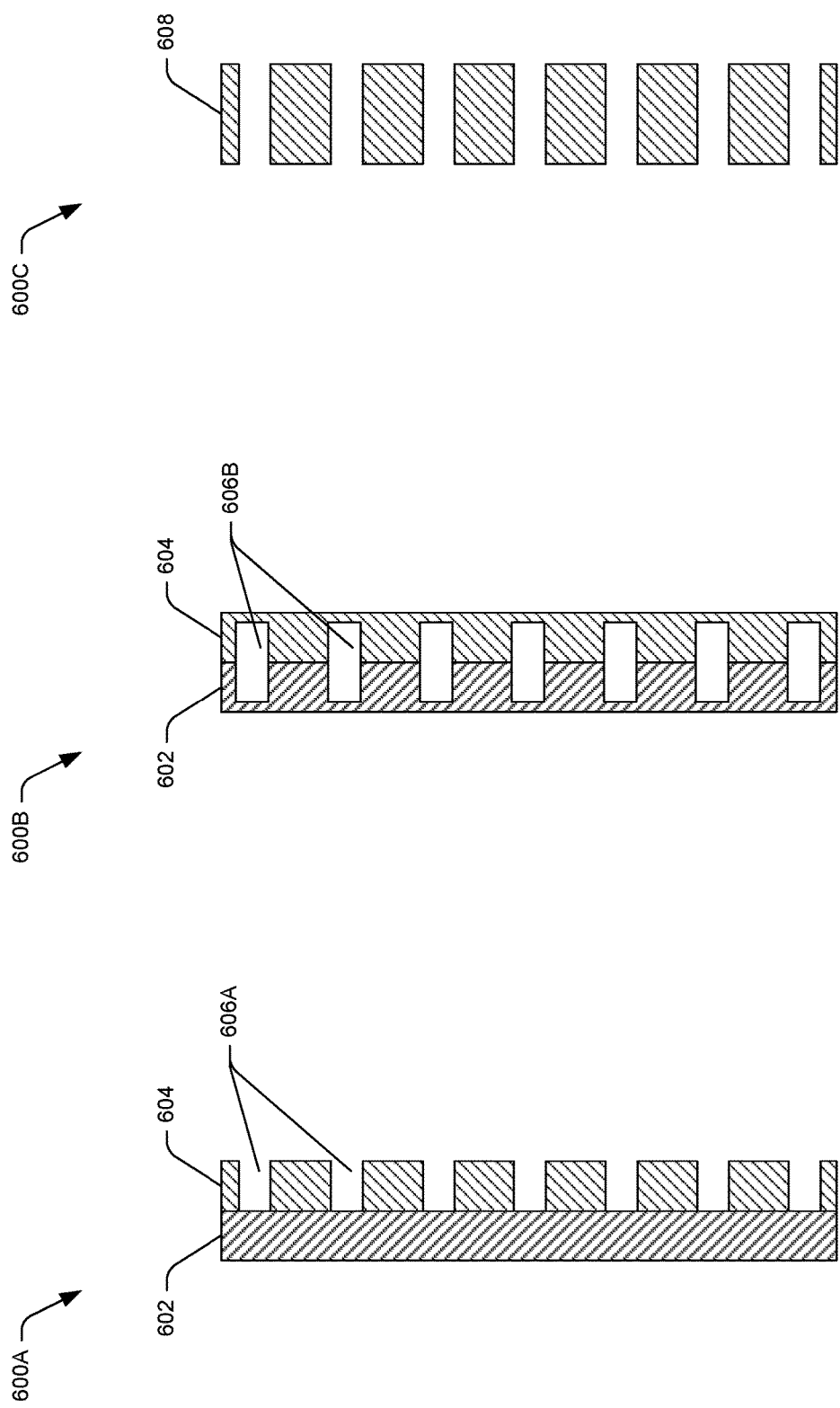

LOW DENSITY ELECTRONIC DEVICE

BACKGROUND

Electronic devices come in many different shapes and sizes, and housings for such devices are made of a wide variety of different materials. Most electronic devices have housings made of hard plastic or metal, which provide at least some structural support and protection for internal components. These hard plastic or metal housings tend to be relatively rigid in order to provide the necessary support and protection for the internal components. One drawback of rigid housings, such as those made of hard plastic or metal is that they do not provide much impact absorption. Thus, display screens and internal components of the electronic devices are more susceptible to damage from impacts, such as drops.

Also, users generally prefer electronic devices to be relatively small and thin. This preference for small/thin devices, combined with the prevalent use of hard plastic or metal means that most electronic devices on the market are relatively dense. This high density can increase user fatigue to hold and use the devices, and can make the devices more susceptible to slipping from the user's hand (especially if the housing is smooth). Additionally, this high density means that the device will sink if dropped in water, often resulting in damage to or loss of the electronic device.

BRIEF DESCRIPTION OF THE DRAWINGS

The detailed description references the accompanying figures. In the figures, the left-most digit(s) of a reference number identifies the figure in which the reference number first appears. The use of the same reference numbers in different figures indicates similar or identical items.

FIGS. 6A-6C are schematic views showing examples of alternative midframe configurations.

DETAILED DESCRIPTION

Figure 1A:
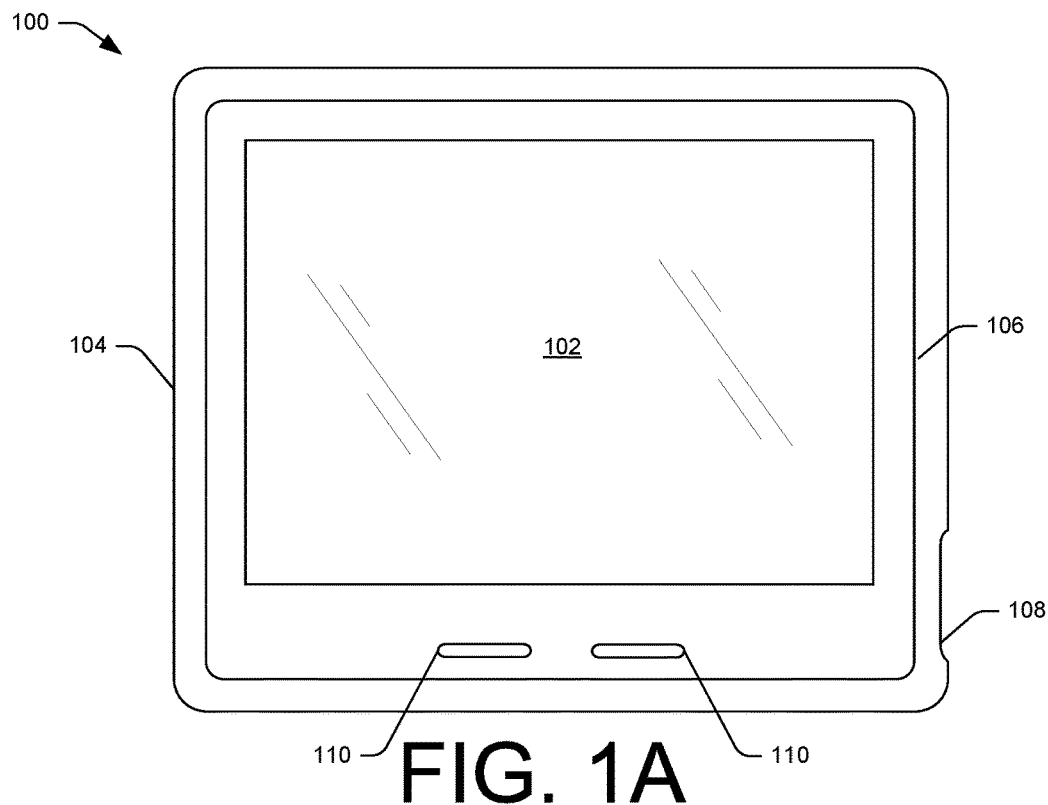
FIG. 1A is a front view of an example low density electronic device.

As discussed above, electronic devices having relatively rigid housings, such as those made of hard plastic or metal, do not provide much impact absorption. Thus, display screens and internal components of the electronic devices are more susceptible to damage from impacts, such as drops. Also, most electronic devices on the market are relatively dense in order to meet form factor constraints (e.g., small and/or thin) that the market demands. However, such high density devices can increase user fatigue to hold and use the devices, can make the devices more susceptible to slipping from the user's hand, and will sink if dropped in water.

This application describes light weight, low density electronic devices and techniques for constructing such electronic devices. In some examples, electronic devices according to this application include a display screen, one or more internal components (e.g., a circuit board, battery, processor(s), memory, radio(s), input(s), output(s), etc.) communicatively coupled to the display screen, and a foam outer housing coupled to the display screen and enclosing the one or more internal components. The foam outer housing includes an opening exposing at least a portion of an external surface of the display screen.

The foam outer housing may be made of a resilient material which flexes or deforms when force is applied to it and then springs back to its original shape. As used herein, a material is "resilient" if it has a compressive modulus of elasticity of less than about 50 mega pascals (MPa). In some examples, the resilient foam outer housing may have a compressive modulus of between about 20 MPa and about 40 MPa. The resilience of the foam outer housing absorbs impacts, such as when the device is dropped, and minimizes damage to the display screen and internal components of the electronic device. The foam outer housing also dampens vibration imparted to the electronic device, to prevent vibration damage. The foam outer housing can be made of any resilient foam material. By way of example and not limitation, the foam outer housing can be made of an amorphous polymer, an elastomeric polymer, or polyurethane foam. In some examples, the polyurethane foam is an aliphatic, self-skinning polyurethane foam that can be injection molded at or near room temperature, such as those made by Covestro®, headquartered in Leverkusen, Germany. In other examples, the outer housing can be made of a non-self-skinning foam, which may or may not be coated with a sealing layer. In still other examples, the outer housing may be made of a material other than foam (e.g., hard plastic, metal, silicone, rubber, etc.), and may be more or less rigid than the foam midframe.

The electronic device may also include a foam midframe interposed between at least a portion of the display screen and the foam outer housing. The foam midframe may include a cavity to receive the one or more internal components, such that the foam midframe and the one or more internal components may occupy a same layer of thickness of the electronic device to maintain a relatively thin form factor for the electronic device. The foam midframe may be made of a relatively rigid foam material to impart stiffness and/or structural integrity to the electronic device. As used herein, a material is "rigid" if it has a compressive modulus of elasticity of at least about 50 mega pascals (MPa). In some examples, the rigid foam midframe may have a compressive modulus greater than about 100 MPa; in some examples the rigid foam midframe may have a compressive modulus between about 130 MPa and about 160 MPa. By way of example and not limitation, the foam midframe can be made of a polymeric foam (e.g., a polyurethane foam, a styrene acrylonitrile foam, polystyrene foam, etc.), a metallic foam (e.g., aluminum foam, iron-based foam, etc.), or a ceramic foam. In some examples, the foam midframe may be made of a closed cell foam which inhibits infiltration during molding of foam outer housing. However, in other examples, an open cell foam may be used for the midframe which allows for some amount of infiltration during molding of foam outer housing, thereby enhancing the bond between the midframe and the foam outer housing. In one specific example, the midframe comprises a rigid polyurethane foam such as FR 3730 available from General Plastics Manufacturing Company of Tacoma, Wash., USA.

In some examples, the foam midframe may have a first rigidity and the foam outer housing may have a second rigidity which is lower than the first rigidity of the foam midframe. In other examples, the foam midframe may be made of a material having a rigidity the same as or even less than the foam outer housing.

In some examples, the foam midframe may include one or more air pockets. The air pockets may extend from a first surface of the midframe partially through a thickness of the rigid foam midframe (i.e., blind holes), extend from the first surface completely through the thickness of the rigid foam midframe to a second surface (i.e., through holes), and/or be voids internal to the foam midframe (i.e., not breaching a surface of the midframe). The air pockets may reduce the weight of the midframe, and consequently reducing the overall density of the electronic device. While described as "air pockets," in some examples, the pockets can be filled with other gasses or low density materials.

In some examples, the electronic device may include a protective shield interposed between the one or more internal components and the foam outer housing. Due to the relatively soft resilient nature of the foam outer housing, the electronic device may be susceptible to damage from compressive forces or punctures. The protective shield may protect the internal components from damage due to punctures or forces applied to the electronic device. In examples in which a rigid foam midframe is employed that includes a cavity to accommodate the one or more internal components, the protective shield may be disposed over the cavity in the rigid foam midframe to protect the one or more internal components. In that case, the one or more internal components are interposed between the protective shield and an internal surface of the display screen. The protective shield may be made of a rigid material having a relatively high strength to weight ratio and/or high toughness. In some examples, the protective shield may be made of a material having a rigidity greater than that of the rigid foam midframe. In some examples, the protective shield may be made of a metal (e.g., aluminum, steel, magnesium, etc.), a plastic (e.g., polypropylene, acrylonitrile butadiene styrene, polyvinyl chloride, polyethylene, etc.), ceramic, or the like.

Both the foam outer housing and the foam midframe (when present) provide a relatively light weight, low density structure for the electronic device. In fact, the foam outer housing and the foam midframe have such a low density that they can be used to construct electronic device with an overall density of less than 1 gram/centimeter$^3$ such that the electronic devices are buoyant in liquid water. In some example electronic devices described herein, a combined density of the display screen and the one or more internal components is greater than about 1 gram/centimeter$^3$, while a density of the foam midframe is at most about 0.65 grams/centimeter$^3$, and a density of the foam outer housing is at most about 0.65 grams/centimeter$^3$, thus resulting in a density of the overall electronic device which is less than 0.9 grams/centimeter$^3$ such that the electronic device is buoyant in liquid water.

In addition to being buoyant in water, in some examples, electronic devices according to this application may be substantially water proof or water resistant. For instance, in some examples, the foam outer housing may consist of a single piece, over-molded around the foam midframe, the one or more internal components, and at least a portion of the display screen. In that case, the foam outer housing may form a bezel around and seal against a periphery of the external surface of the display screen. In some examples, the seal may be enhanced by providing an adhesive between the foam outer housing and at least a portion of the display screen to seal the opening of the foam outer housing to the display screen. In such examples, the display screen and the foam outer housing collectively form a water-tight enclosure to prevent water from reaching the one or more internal components.

The techniques described herein may be applied to a wide variety of electronic devices. In some examples, the electronic devices may include a display screen. Examples of electronic devices including display screens include, by way of example and not limitation, mobile phones (e.g., cell phones, smart phones, etc.), tablet computing devices, electronic book reader devices, laptop or all-in-one computers, media players, portable gaming devices, televisions, monitors, cameras, wearable computing devices, and electronic picture frames. However, the techniques described herein may additionally or alternatively be used with electronic devices that do not include a display screen, such as, for example, audio virtual assistant devices, radios, speakers, personal computers, external hard drives, input/output devices (e.g., remote controls, game controllers, keyboards, mice, touch pads, microphones, speakers, etc.), and the like.

Additional details of these and other examples are described below with reference to the drawings.

Example Low Density Electronic Devices

Figure 1B:
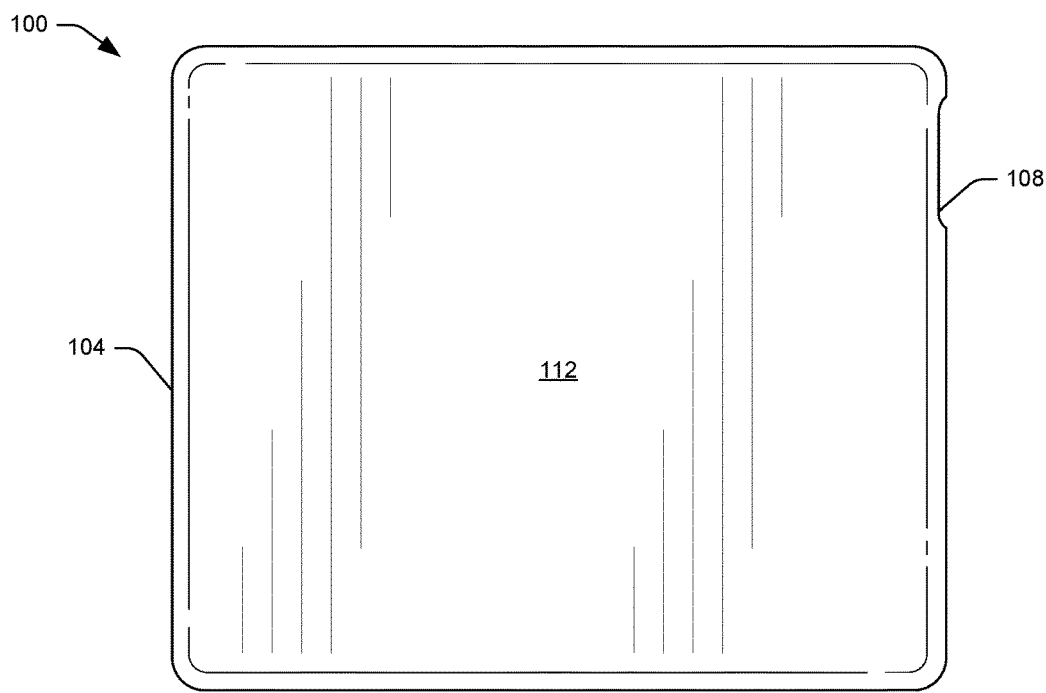
FIG. 1B is a back view of the example low density electronic device of FIG. 1A.

FIGS. 1A and 1B are front and back views, respectively, of an example low density electronic device 100. As shown in FIG. 1A, the low density electronic device 100 includes a display screen 102 for displaying content and an outer housing 104. The display screen 102 has front or external surface (visible in FIG. 1A) and a back or internal surface opposite the front surface (the internal surface being internal to the electronic device and therefore not visible in FIGS. 1A and 1B). The outer housing 104 substantially surrounds the display screen on five sides (i.e., the top, bottom, left, and right peripheral edges of the display screen 102, and the back or internal surface of the display screen) and encloses internal components of the electronic device 100 adjacent to the internal surface of the display screen 102. The outer housing 104 wraps around the peripheral edges of the display screen 102 and overlaps an outer peripheral portion of the front or external surface of the display screen 102. Thus, the outer housing 104 provides a bezel 106 around the periphery of the external surface of the display screen 102, which may provide a water resistant seal between the outer housing 104 and the display screen 102.

The outer housing 104 may, in some examples, be made of a resilient foam material, such as those described above. In that case, the outer housing 104 may provide impact absorption to protect the display screen 102 and internal components of the electronic device 100. Additionally or alternatively, the outer housing 104 may have a density of less than 1 gram/centimeter$^3$ and, as such, may alone or in combination with other elements make the electronic device 100 buoyant in liquid water.

In this example, the outer housing 104 includes a recessed opening 108 or finger scoop providing access to one or more controls and/or ports (not shown in this figure) of the electronic device 100. In some examples, the control(s) and/or port(s) exposed by the recessed opening 108 may be waterproof In other examples, the recessed opening 108 may include a waterproof cover over the control(s) and/or port(s) to prevent water from infiltrating the outer housing 104. For instance, the cover may comprise a flexible water-impermeable membrane through which the user may actuate one or more controls and through which the information may be transmitted wirelessly (e.g., optically, magnetically, via radio frequency transmissions, etc.). Alternatively, the cover may comprise an openable flap or plug that can be unfastened or removed from the recessed opening 108 to access the control(s) and/or port(s).

The electronic device 100 also includes two buttons or other controls 110 disposed in the front surface of the display screen 102. The controls 110 are illustrated as physical depressible buttons in this example, but in other examples, the controls 110 may comprise soft touch screen controls, touch sensors (e.g., capacitive touch sensors, pressure sensitive touch sensors, membrane touch sensors, etc.).

As shown in FIG. 1B, in this example, the outer housing 104 of the electronic device 100 includes substantially planar, rectangular back surface 112. However, in other examples, other non-planar and/or non-rectangular geometries are also possible. For instance, electronic devices according to this application may have a stepped, sloped, or irregular back surface. Additionally or alternatively, electronic devices according to this application may have generally circular, oval, square, triangular, hexagonal, free form, or other shaped perimeters.

Figure 2:
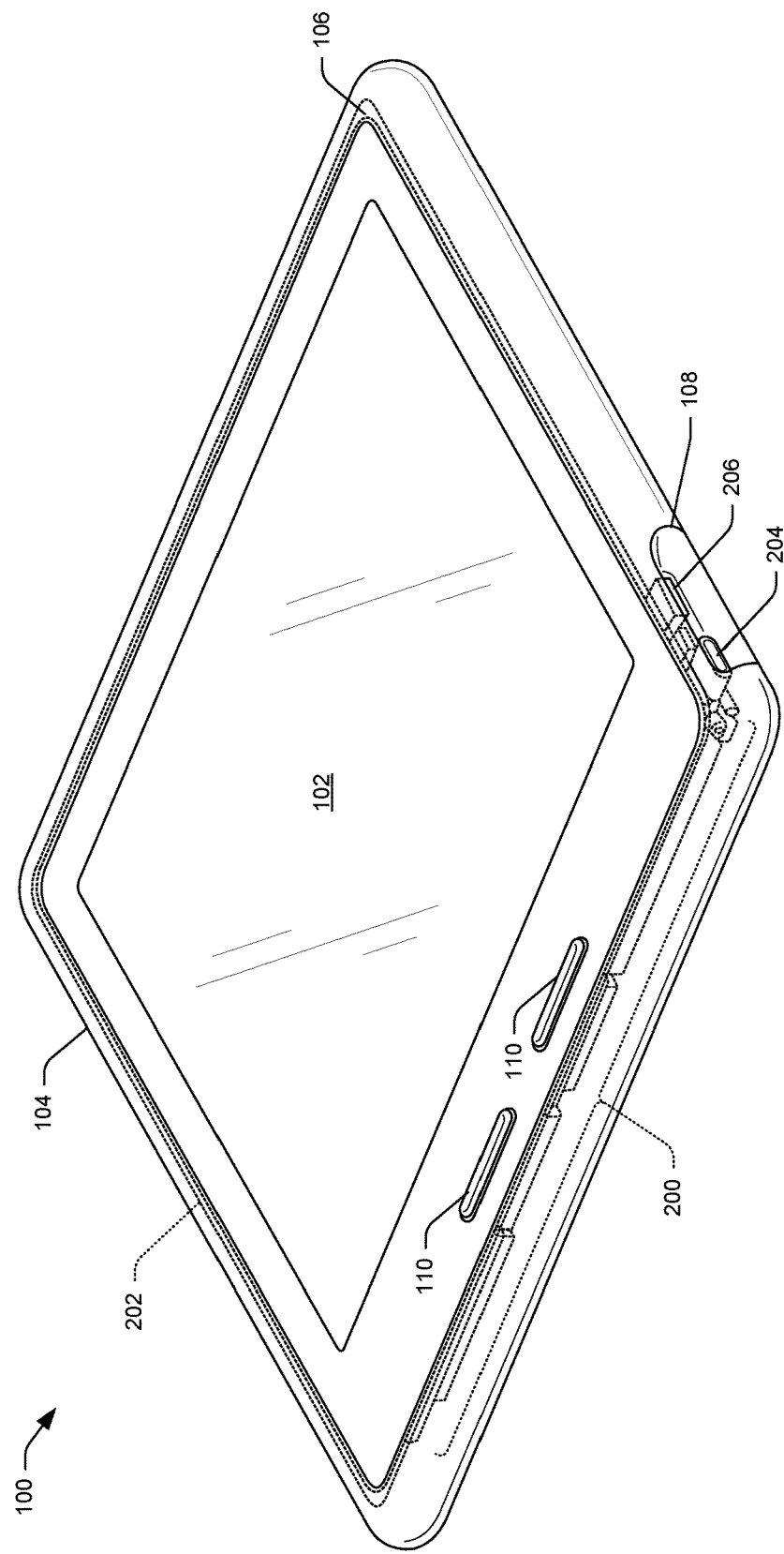
FIG. 2 is a perspective view of the example low density electronic device of FIG. 1A, with an outer housing shown as translucent to better illustrate internal components.

FIG. 2 is a perspective view of the electronic device 100 taken above. In this example, the outer housing 104 of the electronic device 100 is shown as being translucent and the midframe is omitted to illustrate internal components 200 of the electronic device 100. The internal components 200 are shown in broken lines. Depending on the desired functionality of the electronic device 100, internal components 200 may include one or more a circuit boards, batteries, processors, memory, radios (e.g., WiFi, Bluetooth, cellular, etc.), inputs, outputs, or other electrical or non-electrical components used in the construction of electronic devices.

FIG. 2 better illustrates the overlap of the outer housing 104 to provide a bezel 106 around the perimeter 202 of the display screen 102. In particular, the outer housing 104 wraps up around the lateral surfaces (top, bottom, left, and right edges) of the display screen 102 and onto an outer portion of the front or exterior surface of the display screen 102. Because the bezel 106 projects outwardly from the exterior surface of the display screen 102 and is made of a resilient material, the bezel 106 provides protects the display screen 102 from frontal impacts (e.g., if the electronic device were dropped face down).

FIG. 2 also illustrates the controls and ports accessible via the recessed opening 108. In particular, in this example, a power button 204 and a universal serial bus (USB) port 206 are provided. However, as mentioned above, in other examples, other types of controls and ports may be included including waterproof and/or sealed controls and ports. Additionally or alternatively a cover or plug (not shown) may be included to seal the recessed opening. Or, in other examples, the recessed opening 108 may be omitted entirely.

Figure 3:
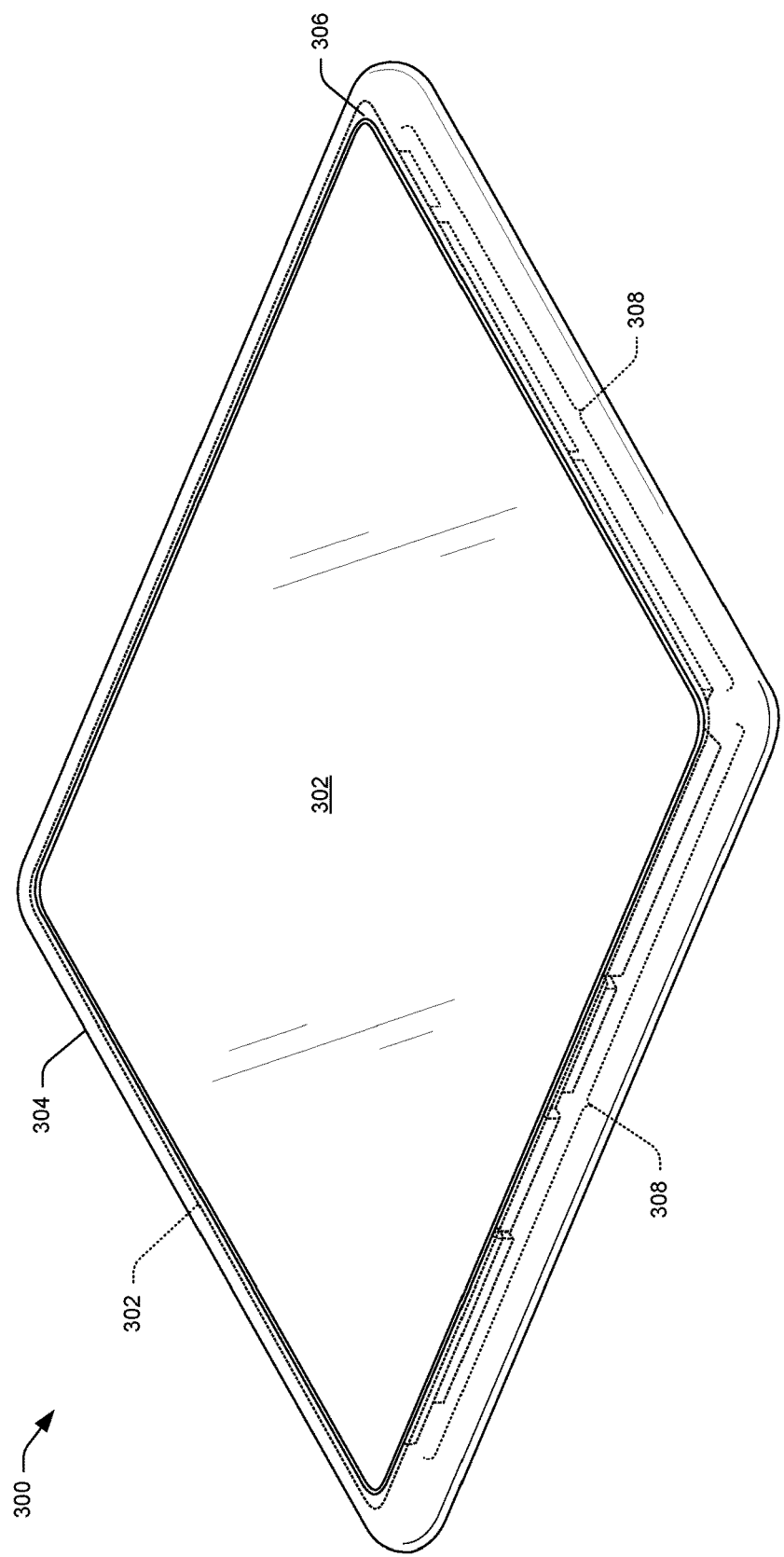
FIG. 3 is a perspective view of an alternative example low density electronic device that is free of external buttons and ports.

FIG. 3 illustrates an example electronic device 300 which omits a recessed opening and physical controls altogether in favor of touch or gesture based controls and wireless charging, inputs, and outputs. Like electronic device 100, the electronic device 300 includes a display screen 302 and an outer housing 304 that wraps around an outer perimeter of the display screen 302 and provides a bezel 306 that overlaps a perimeter of a front or exterior surface of the display screen 302. The electronic device 300 also includes internal components 308 such as those described above with respect to electronic device 100. However, the electronic device 300 omits external controls and ports. Instead, the electronic device 300 employs touch or gesture based controls via the touch inputs to the display screen 302 or other touch sensitive surfaces and/or gesture inputs received via one or more cameras or proximity sensors of the electronic device 300. Additionally, the electronic device 300 employs wireless charging (e.g., via inductive charging or sealed electrical contacts) and wireless data transfer (e.g., via WiFi, Bluetooth, near field communication, or the like).

Figure 4:
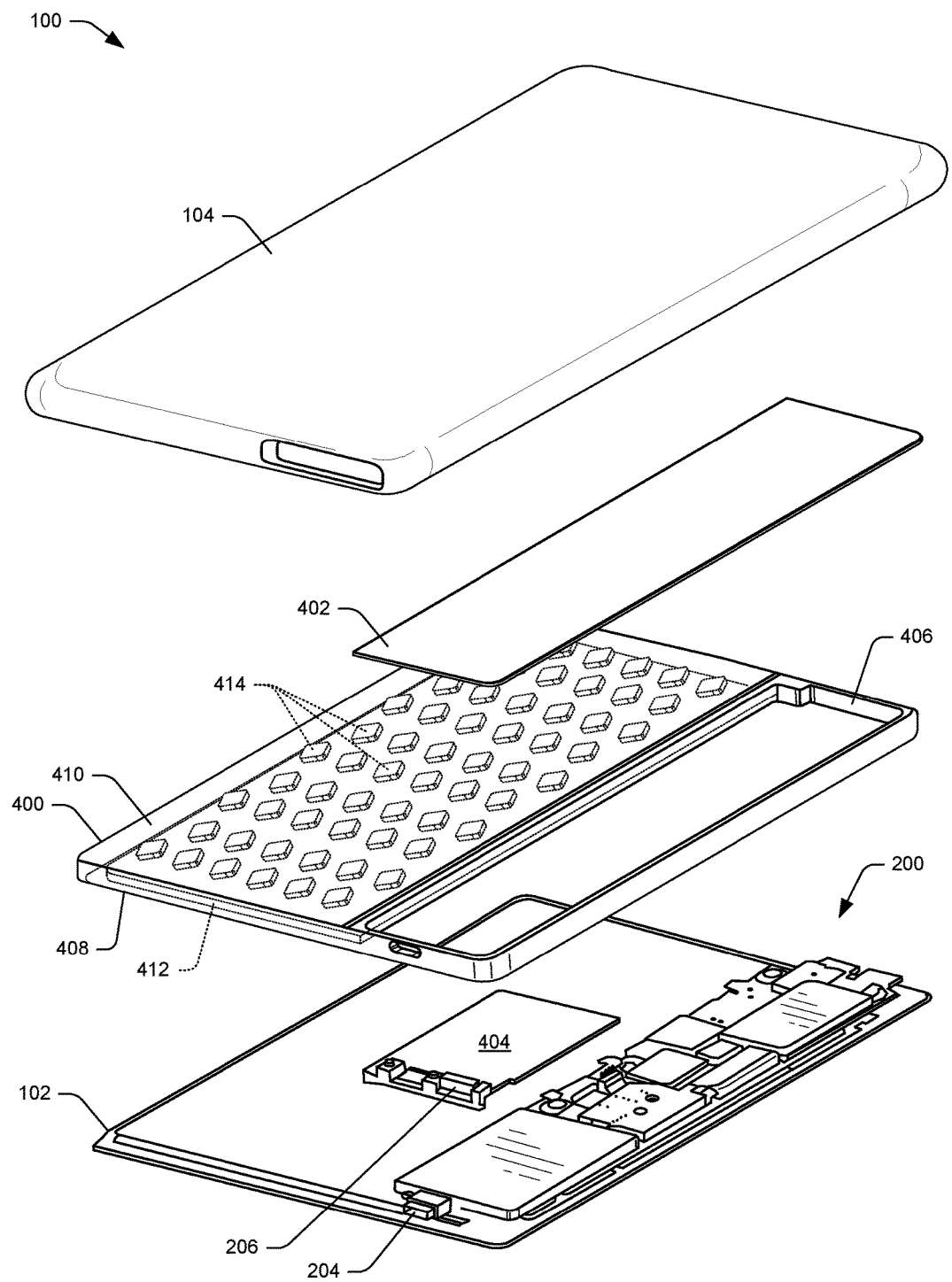
FIG. 4 is an exploded view of the example low density electronic device of FIG. 1A, showing a display screen, internal components, a midframe, a protective shield, and an outer housing.

FIG. 4 is an exploded view of the example low density electronic device 100, showing from bottom to top the display screen 102, internal components 200, a midframe 400, a protective shield 402, and the outer housing 104. As discussed above, the electronic components 200 include a circuit board, a battery, one or more processors, memory, radio(s), input(s), output(s), among other things. The electronic components 200 are arranged adjacent to interior or back surface of the display screen 102 in an elongated rectangular region along a bottom edge of the display screen (when the electronic device is viewed from the front). A holder 404 fits over an end portion of the rectangular region occupied by the electronic components 200 to retain and support the USB port 206. The holder 404 includes an opening to fit over the power button 204.

The midframe 400 in this example is a rigid foam midframe that provides stiffness and structural integrity to the electronic device 100 while adding minimal weight. The midframe 400 includes a cutout or cavity 406 sized and shaped to receive and accommodate the internal components 200. Thus, the cavity 406 in this example is a substantially rectangular region disposed along a bottom edge of the midframe 400. The cavity 406 in this example extends completely through the midframe 400 (i.e., through a whole thickness of the midframe). However, in other examples, such as when thinner internal components are used, the cavity 406 may be less than the full thickness of the midframe 400. In that case the cavity may comprise a blind cavity or hollowed out portion that extends only a portion of the thickness of the midframe 400. In the illustrated example, where the cavity 406 extends completely through the midframe 400, the midframe 400 and the internal components 200 may occupy a same layer of thickness of the electronic device 100 to maintain a relatively thin form factor for the electronic device 100.

The midframe 400 includes a first side 408 adjacent the display screen 102 and a second side 410 opposite the first side 408. The second side 410 in this example comprises a substantially planar surface extending from the cavity 406 to the top edge of the midframe 400. The first side 408 of the midframe 400 includes a substantially rectangular recessed region 412 to accommodate the display stack and traces on the back of the display screen 102. Additionally, the first side 408 of the midframe 400 includes a plurality of air pockets 414. The air pockets 414 further reduce the weight of the midframe 400, and also provide additional airspace inside the electronic device 100 which helps to dissipate heat from the device. The air pockets 414 in this example comprise blind recesses formed into the recessed region 412 of the first side 408 of the midframe 400. In this example, the air pockets 414 are diamond shaped blind recesses. However, in other examples the recesses may not be blind recesses (e.g., they may be through holes, or internal voids in the midframe) and/or they may not be diamond in shape (e.g., they may be circular, oval, square, rectangular, hexagonal, irregular in shape, etc.). Several other variations are described below with respect to FIGS. 5A-5C. The use of diamond shaped recesses arranged in staggered rows, as shown in this example, provides good strain resistance (i.e., minimizes reduction of stiffness of the midframe due to formation of the air pockets).

In some examples, the midframe 400 may be machined from a sheet or block of foam material (e.g., by a computer numeric controlled (CNC) mill). In other examples, the midframe 400 maybe injection molded, cast, punched or stamped from a sheet of foam material, formed of multiple pieces or sheets of material that are laminated together, or the like.

The protective shield 402 is sized to cover the cavity 406 formed in the midframe 400 to protect the internal components 200 from damage due to forces applied to, or punctures through, the outer housing 104 from the back of the electronic device 100. The internal components 200 are interposed between the protective shield 402 and the internal surface of the display screen 102. In this example, the protective shield 402 is made of aluminum. However, as discussed above, in other examples the protective shield may be made of other metals (e.g., steel, magnesium, etc.), plastic (e.g., polypropylene, acrylonitrile butadiene styrene, polyvinyl chloride, polyethylene, etc.), ceramic, or the like.

Once the display screen 102, internal components 200, midframe 400, and protective shield 402 are assembled, the outer housing 104 is installed. In some examples discussed in more detail below, the outer housing 104 can be injection molded as a single-piece around the other components of the electronic device 100. However, in other examples, the outer housing 104 can formed (e.g., molded, cast, machined, etc.) and then the other components (e.g., display screen 102, internal components 200, midframe 400, and protective shield 402) can be installed in the outer housing 104 (e.g., by adhesive, snap fit, fasteners, etc.). In some examples, the outer housing 104 can be formed (e.g., by injection molding) and then stretched and/or deformed in order to install the other components within the outer housing 104, or the outer housing can be formed as multiple pieces and then secured around the other components (e.g., by snapping, adhering, sonically welding, or otherwise attaching the multiple components of the outer housing around the other components of the electronic device).

FIGS. 5A-5C and FIGS. 6A-6C illustrate alternative midframe configurations. The number, size (length, width, and/or depth), shape, and configuration of air pockets used in midframes according to these examples may vary depending on the desired weight, stiffness, buoyancy, and/or thermal characteristics of the electronic device. The midframe configurations shown in FIGS. 5A-5C and FIGS. 6A-6C are but a few of many possible variations and should not be considered exhaustive. While in some examples, the dimensions of the air pockets are illustrated as being the same as one another, in other examples, the air pockets may include air pockets of multiple different dimensions (length, width, and/or depth).

Figure 5C:
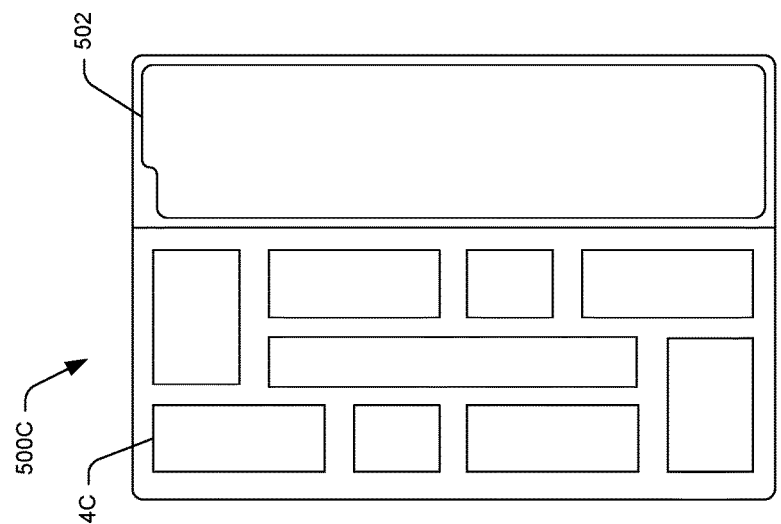
FIGS. 5A-5C are schematic views showing examples of alternative midframe configurations.
Figure 5B:
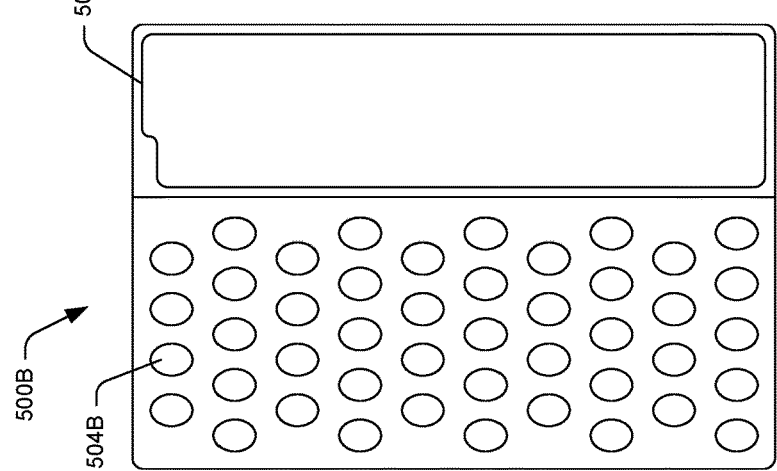
Figure 5A:
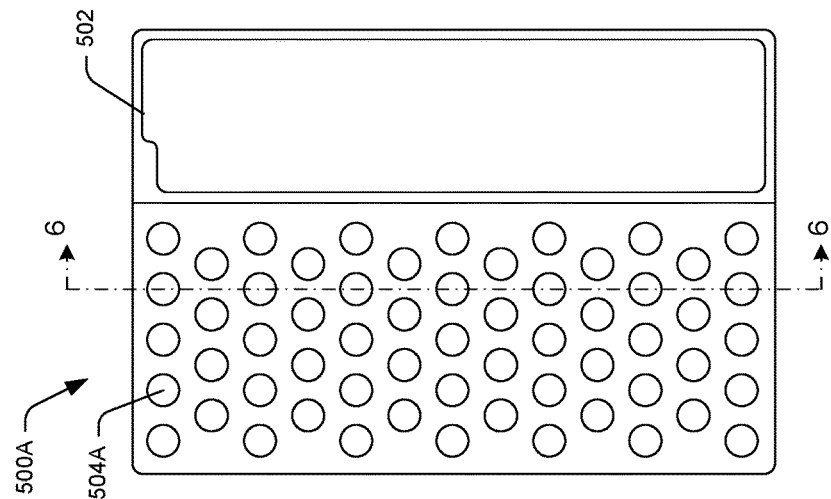

In particular, FIG. 5A illustrates a midframe 500A including a cavity 502 and a plurality of cylindrical air pockets 504A. The air pockets 504A may be blind holes, through holes, or internal voids that do not penetrate the first or second sides of the midframe. In this example, the air pockets 504A are arrayed in thirteen rows, with each row alternately including either five or four air pockets 504A. The air pockets 504A in each row are staggered or offset relative to the air pockets 504A in adjacent rows.

FIG. 5B illustrates a midframe 500B which is similar to midframe 500A, except that it includes a plurality of ovoid air pockets 504B. The air pockets 504B may be blind holes, through holes, or internal voids that do not penetrate the first or second sides of the midframe. In this example, the air pockets 504B are arrayed in ten rows, with each row alternately including either four or five air pockets 504B. The air pockets 504B in each row are staggered or offset relative to the air pockets 504B in adjacent rows. While the ovals in this example are shown as being elongated in the widthwise direction (i.e., toward the sides of the electronic device as shown in FIG. 1A), in other examples, the ovals may be elongated in the height direction (i.e., toward the top and bottom of the electronic device as shown in FIG. 1A).

FIG. 5C illustrates a midframe 500C which is similar to midframe 500A, except that it includes a plurality of rectangular air pockets 504C. The air pockets 504C may be blind holes, through holes, or internal voids that do not penetrate the first or second sides of the midframe. In this example, the air pockets 504C include multiple different shapes and sizes of rectangles. The air pockets 504C are arranged in interlocking and overlapping pattern to minimize loss of rigidity due to the formation of the air pockets.

FIGS. 6A-6C illustrate cross sections of midframes taken along line 6-6 in FIG. 5A. The thickness or depth of the midframes are exaggerated in FIGS. 6A-6C for ease of illustration and do not match the scale of FIGS. 5A-5C.

FIG. 6A illustrates a midframe 600A constructed by coupling two pieces of foam material together. A first piece 602 comprises a solid piece of foam material that can be machined, cut, stamped, or punched from a larger sheet of foam material. A second piece 604 may also be machined, cut, stamped, or punched from the same or different sheet of foam material, and may also have multiple air pockets 606A formed therein by machining, cutting, stamping, or punching. The first piece 602 and second piece 604 may be coupled together by an adhesive (e.g., pressure sensitive adhesive), thermal bonding, sonic welding, or other suitable adhesion or bonding techniques. The first piece 602 and the second piece 604 may be made of the same material or different materials. If made from different materials, the first piece 602 and the second piece 604 may have different characteristics (e.g., rigidity, density, thermal conductivity, etc.). Once the first piece 602 and the second piece 604 are coupled, the air pockets 606A in this example are configured as blind holes.

FIG. 6B illustrates a midframe 600B similar to the two-piece construction of midframe 600A, except that the air pockets 606B in this example are internal voids.

FIG. 6C illustrates a midframe 600C formed of a single piece 608 of foam material. The midframe 600C may also be machined, cut, stamped, or punched from a sheet of foam material, and may also have multiple air pockets 606C formed therein by machining, cutting, stamping, or punching. The air pockets 606C in this example are configured as through holes.

Figure 7:
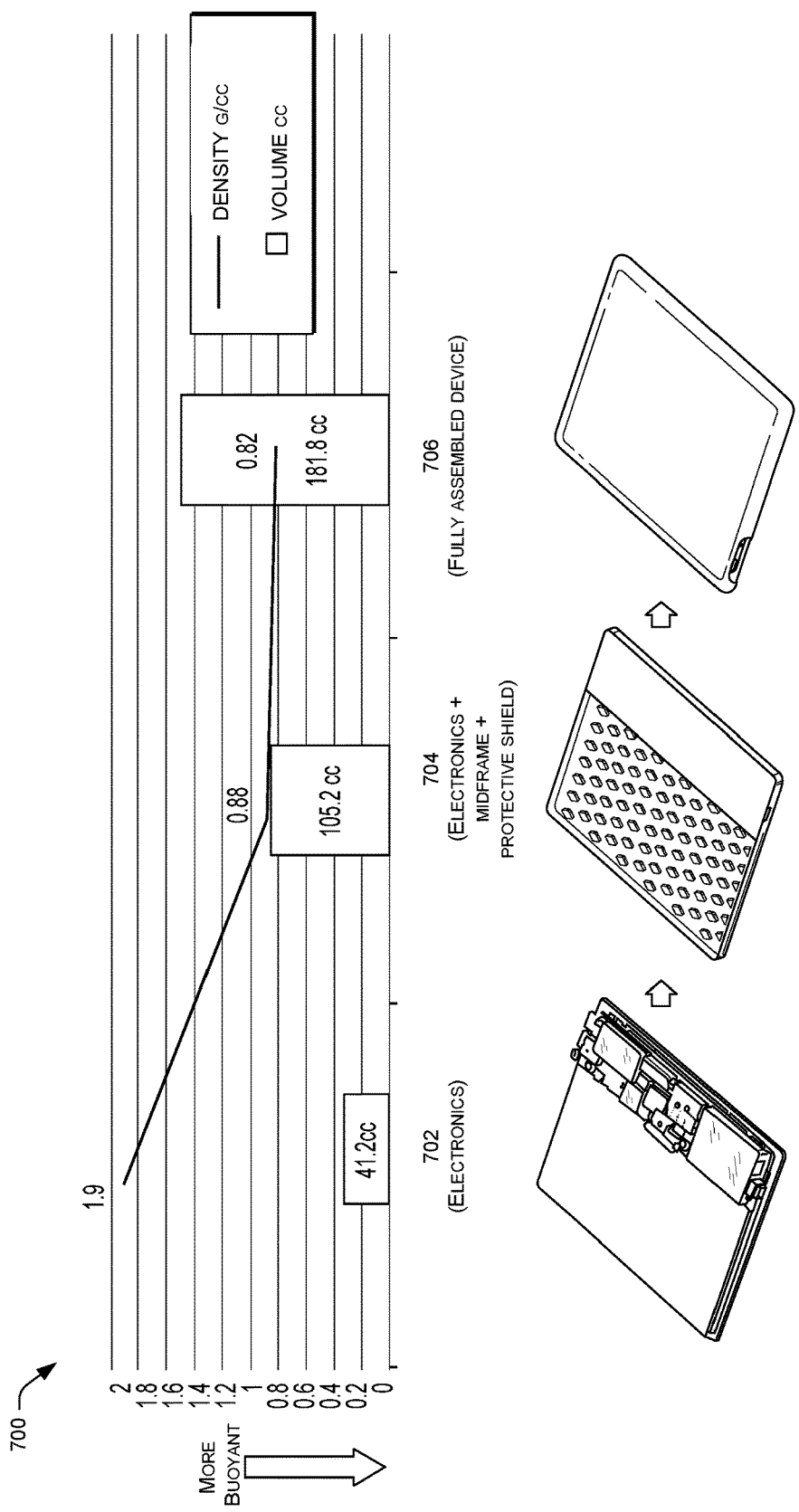
FIG. 7 is a bar chart depicting how various components of the example low density electronic device of FIG. 1A contribute to overall density of the low density electronic device.

FIG. 7 is a bar chart 700 depicting how various components of the example low density electronic device 100 of FIG. 1A contribute to overall density of the low density electronic device 100. The vertical axis shows the density, the horizontal axis shows various stages of assembly, the value in each bar represents the volume of the device at the given stage of assembly, and the value of the line plot represents the density at the given stage of assembly. As shown at stage 702, the electronics (i.e., display screen and internal components) occupy a volume of 41.2 centimeters$^3$ and have a combined density of 1.9 grams/centimeter$^3$ (almost twice as dense as water and therefore not buoyant). As shown at stage 704, once the foam midframe and proactive shield are added to the electronics, the components occupy a volume of 105.2 centimeters$^3$ and have a combined density of 0.88 grams/centimeter$^3$ (less than the density of liquid water and therefore buoyant). As shown at stage 706, once the outer housing is added, the fully assembled device occupies a volume of 181.8 centimeters$^3$ and has an overall density of 0.82 grams/centimeter$^3$ (significantly less than the density of liquid water and therefore buoyant).

Figure 8:
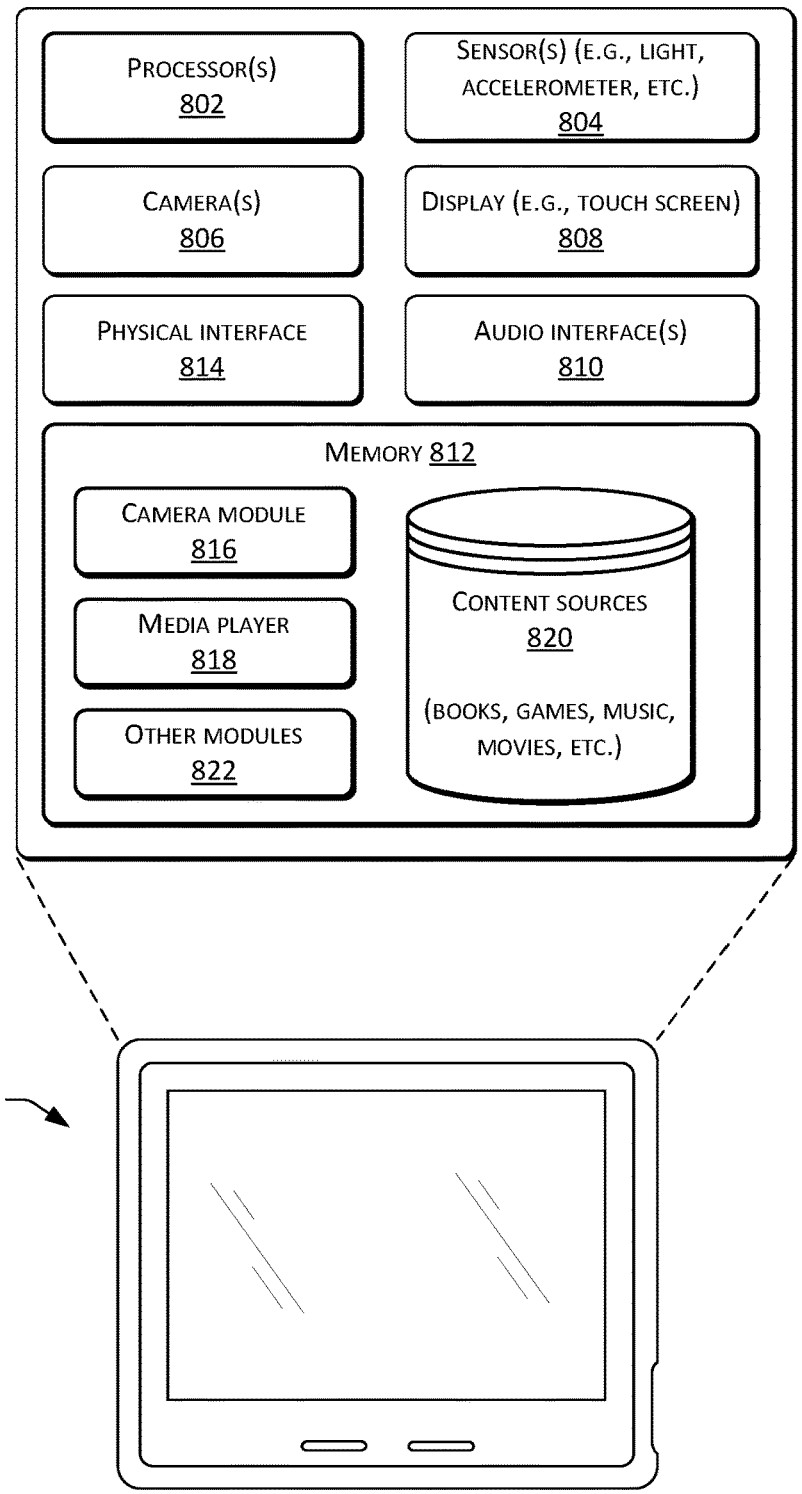
FIG. 8 is a block diagram of an example low density electronic device, such as those depicted in FIG. 1A and FIG. 3.

FIG. 8 is a block diagram illustrating logical components (e.g., software and hardware) of example low density electronic device 800, and may be representative of any of the foregoing examples. By way of example and not limitation, electronic device 800 may be configured as an electronic book reader device, tablet computer, mobile device, portable gaming device, electronic picture frame, display screen, or the like. As shown in FIG. 8, the electronic device 800 includes one or more processors 802 communicatively coupled to one or more sensors 804, one or more cameras 806, a display 808, one or more audio interfaces 810, memory 812, and other components (e.g., battery, radio(s), input(s), output(s), etc.). The electronic device 800 may also include a physical interface 814 including one or more buttons, switches, dials, or other controls disposed in or on the electronic device.

The sensors 804 may include light sensors, accelerometers, touch sensors, transceivers (e.g., WiFi, Bluetooth, near field communication, etc.), navigation sensors (e.g., compass, global positioning satellite system, etc.), or the like. Further, though they are shown as separate blocks in this figure, the camera(s) 806 and audio interface(s) 810 of the electronic device are also examples of sensors of the electronic device.

The camera(s) 806 may include a front facing camera integrated with the display screen on the front of the electronic device 800 and/or a rear facing camera disposed on a rear surface of the electronic device. While not illustrated in the other figures, in that case, an aperture or opening may be formed in the back surface of the outer housing to accommodate the rear facing camera.

The display 808 may comprise, for example, a liquid crystal display (LCD), a light emitting diode display (LED), a plasma display, an electronic ink (e-ink) display, a cathode ray tube (CRT) display, a flexible display, a combination of any of the foregoing, or other display technologies. In some examples, the display 808 may comprise a touch screen display capable of receiving input by touching the screen with a finger, hand, thumb, stylus, or other pointing device.

The audio interface(s) 810 may include one or more audio inputs (e.g., microphones, audio-in jacks, etc.) and/or one or more audio outputs (e.g., speakers, headphone jack, etc.). Additionally or alternatively, the audio interface(s) 810 may be wireless (e.g., WiFi, Bluetooth, etc.).

Memory 812 may include a plurality of modules to implement various operations. For instance, the memory 812 may include a camera module 816 that controls operation of the camera(s) 806 and provides a user interface for the user to interact with and control the camera(s) 806. The memory 812 also includes a media player 818 of the electronic device 800 to begin playing content from one or more content sources 820 stored in the memory 812 of the device. The memory 812 may also include one or more other modules 822 configured to perform a variety of other operations.

Memory 812 is shown to include software functionality configured as one or more applications or "modules." However, the modules are intended to represent example divisions of the software for purposes of discussion, and are not intended to represent any type of requirement or required method, manner or necessary organization. Accordingly, while various "modules" are discussed, their functionality and/or similar functionality could be arranged differently (e.g., combined into a fewer number of modules, broken into a larger number of modules, etc.).

The modules may include instructions executable by the one or more processors 802 to implement the functionalities they are described as performing. The electronic device 800 may additionally or alternatively include one or more hardware components (e.g., application specific integrated circuits, field programmable gate arrays, systems on a chip, and the like) to implement some or all of the functionalities the modules are described as performing.

The memory 812 described herein is an example of non-transitory computer-readable media and may take the form of volatile memory, such as random access memory (RAM) and/or non-volatile memory, such as read only memory (ROM) or flash RAM. Non-transitory computer-readable media includes volatile and non-volatile, removable and non-removable media implemented in any method or technology for storage of information such as computer-readable instructions, data structures, program modules, or other data for execution by one or more processors of a computing device. Examples of non-transitory computer-readable media include, but are not limited to, phase change memory (PRAM), static random-access memory (SRAM), dynamic random-access memory (DRAM), other types of random access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transmission medium that can be used to store information for access by a computing device. As defined herein, computer-readable media does not include transitory media, such as modulated data signals and carrier waves.

Example Manufacturing Processes

The example electronic devices described herein can be made by over-molding a foam outer housing around internal components of the electronic device. In some examples, the foam outer housing may also be over-molded around a rigid foam midframe, which may provide additional stiffness and structural integrity to the electronic device. In some examples, the foam outer housing may be molded at least partially around the display screen (e.g., around a periphery of an external surface of the display screen) to secure the foam outer housing to the display screen. In that case, the foam outer housing may form a bezel around the periphery of the external surface of the display screen, which may provide a water resistant seal between the foam outer housing and the display screen. In some examples, the seal between the foam outer housing and the display screen may additionally or alternatively be formed by applying an adhesive to at least a portion of the display screen (e.g., peripheral edges of the display screen, a border around the periphery of the external surface, etc.) prior to over-molding the foam outer housing to bond the foam outer housing to the display screen.

By way of example, the foam outer housing may be over-molded to the electronic device by inserting the components of the electronic device, such as the display screen, internal components (e.g., a circuit board, battery, processor(s), memory, radio(s), input(s), output(s), etc.), foam midframe, and/or protective shield, into a mold enclosure and injecting a polymer material into the mold enclosure. The polymer material is forced into the mold enclosure where it fills and takes the form of the empty space between components of the electronic device and the mold enclosure. The term mold enclosure, as used herein, describes a sealed enclosure that can be formed by a physical connection of two or more complementary parts. In some examples, the mold enclosure can be formed by two complementary mold tools. In other examples, the mold enclosure can be formed by the physical connection of a mold tool with a fabricated part of the electronic device, such as a bezel, display screen, etc.

In some embodiments, the injection molding process can include a high pressure injection of polymer material at a high temperature. The polymer material subsequently cools and solidifies to adopt the configuration of the mold enclosure. In other examples, the injection molding process can include a high pressure injection of a polymer material at or near room temperature.

In various examples, the injection molding process can use one or more different types of polymer materials. In some examples, the polymer material can include an amorphous polymer, an elastomeric polymer or polyurethane foam. In at least one example, the polyurethane foam is a self-skinning foam that can be injected into the mold enclosure at room temperature. The term self-skinning, as discussed herein, is used to describe a type of foam that produces a high-density skin and a lower-density core once it solidifies. An advantage of self-skinning foam is that it retains an overall low density, thus contributing to buoyancy of the electronic device. Another advantage of self-skinning foam is that it is flexible foam which is malleable or resilient when pressure is applied. This malleability and resiliency provides impact absorption to protect the display screen and internal components of the electronic device. Additionally, the malleability and resiliency of the foam outer housing provides a measure of sealing between the foam outer housing and the display screen, as well as a measure of self-sealing (e.g., if the foam outer housing is punctured).

The fabrication process described herein provide a means of efficiently fabricating a single-piece housing that caters for different arrangements of internal components while supporting device functionality and maintaining a consistent level of consumer appeal. The single-piece foam outer housing also provides an impermeable, water resistant enclosure, which can be readily sealed to the display screen to prevent water from reaching internal components of the electronic device. In addition, by fabricating a single-piece housing, the overall assembly process is simplified by removing any use for snaps, bosses, fasteners, screws or other assembly fixtures.

Additional details of example manufacturing processes that may be used to make the example electronic devices described herein can be found in U.S. patent application Ser. No. 14/733,799, to Rajagopalan et al., entitled "Over-Mold Foam Enclosure," which is incorporated herein by reference.

CONCLUSION

While various examples and embodiments are described individually herein, the examples and embodiments may be combined, rearranged and modified to arrive at other variations within the scope of this disclosure.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

What is claimed is:

1. A buoyant electronic device comprising:
   a display screen having an external surface and an internal surface opposite the external surface;
   a rigid foam midframe disposed adjacent to at least a portion of the internal surface of the display screen, the rigid foam midframe including a cavity that extends through a thickness of the rigid foam midframe; one or more internal components including a circuit board, the one or more internal components disposed in the cavity of the rigid foam midframe and communicatively coupled to the display screen; and
   a resilient foam outer housing being over-molded and in contact with the rigid foam midframe and at least a first portion of the external surface of the display screen, the resilient foam outer housing disposed adjacent to at least one side of the cavity to form a water-tight enclosure with the display screen to inhibit water from reaching the one or more internal components, the resilient foam outer housing having a rigidity lower than the rigid foam midframe, and the resilient foam outer housing including an opening exposing at least a second portion of the external surface of the display screen,
   wherein a density of the buoyant electronic device is less than 1 gram/centimeter$^3$ such that the buoyant electronic device is buoyant in liquid water.

2. The buoyant electronic device of claim 1, further comprising a protective metal shield disposed over the cavity in the rigid foam midframe to protect the one or more internal components, wherein the one or more internal components are interposed between the protective metal shield and the internal surface of the display screen.

3. The buoyant electronic device of claim 1, wherein the rigid foam midframe comprises a plurality of air pockets extending at least partially through a thickness of the rigid foam midframe.

4. An electronic device comprising:
   a display screen having an external surface and an internal surface opposite the external surface;
   a foam midframe disposed adjacent to at least a portion of the internal surface of the display screen, the foam midframe including a first portion and a second portion adjacent to the first portion, the first portion having one or more pockets extending at least partially through a thickness of the foam midframe, the second portion having a cavity extending through the thickness of the foam midframe; one or more internal components including a circuit board, the one or more internal components communicatively coupled to the display screen and disposed within the cavity; and
   an outer housing coupled to the display screen and enclosing the foam midframe and disposed adjacent to at least one side of the cavity, the outer housing and the display screen forming a water-tight seal to inhibit water from reaching the one or more internal components, the outer housing including an opening exposing at least a portion of the external surface of the display screen.

5. The electronic device of claim 4, wherein the foam midframe has a first rigidity and the outer housing has a second rigidity which is lower than the first rigidity of the foam midframe.

6. The electronic device of claim 4, wherein the foam midframe has a first rigidity and the outer housing has a second rigidity which is higher than the first rigidity of the foam midframe.

7. The electronic device of claim 4, wherein the foam midframe comprises a rigid foam and the outer housing comprises a resilient foam.

8. The electronic device of claim 4, wherein:
the portion of the external surface of the display screen comprises a first portion of the external surface of the display screen; and
the outer housing consists of a single piece material over-molded around the foam midframe, the one or more internal components, and at least a second portion of the external surface of the display screen.

9. The electronic device of claim 8, wherein the outer housing forms a bezel around a periphery of the external surface of the display screen.

10. The electronic device of claim 4, further comprising an adhesive disposed between the outer housing and the at least the portion of the external surface of the display screen to seal the opening of the outer housing to the display screen.

11. The electronic device of claim 4, wherein the display screen and the outer housing collectively form a water-tight enclosure to prevent water from reaching the one or more internal components.

12. The electronic device of claim 4, further comprising a rigid protective shield interposed between the one or more internal components and the outer housing.

13. The electronic device of claim 4, wherein a density of the electronic device is less than 1 gram/centimeter$^3$ such that the electronic device is buoyant in liquid water.

14. An electronic device comprising:
a display screen having an external surface and an internal surface opposite the external surface;
one or more internal components including a circuit board, the one or more internal components communicatively coupled to the display screen;
a foam midframe, the foam midframe including a cavity to receive the one or more internal components; and
a foam outer housing over-molded around the one or more internal components and at least a first portion of the external surface of the display screen, the foam outer housing coupling to the at least the first portion of the display screen and enclosing the one or more internal components to form a water-tight seal to inhibit water from reaching the one or more internal components, the foam outer housing including an opening exposing at least a second portion of the external surface of the display screen, the foam outer housing disposed adjacent to at least one side of the cavity;
wherein a density of the electronic device is less than 1 gram/centimeter$^3$ such that the electronic device is buoyant in liquid water.

15. The electronic device of claim 14, wherein:
the foam midframe is interposed between at least a portion of the display screen and the foam outer housing;
the foam outer housing is over-molded around the foam midframe;
the foam midframe has a first rigidity; and
the foam outer housing has a second rigidity which is lower than the first rigidity of the foam midframe.

16. The electronic device of claim 14, wherein the foam midframe includes a plurality of air pockets extending at least partially through a thickness of the foam midframe.

17. The electronic device of claim 14, further comprising a protective metal shield interposed between the one or more internal components and the foam outer housing.

18. The electronic device of claim 4, wherein the second portion of the foam midframe forms at least part of an exterior perimeter of the foam midframe.

19. The electronic device of claim 4, wherein a first area of the first portion of the foam midframe is larger than a second area of the second portion of the foam midframe.

* * * * *